United States Patent
Mehrgardt

(10) Patent No.: US 9,967,761 B2
(45) Date of Patent: May 8, 2018

(54) MEASUREMENT HOUSING FOR A COMMUNICATION DEVICE

(71) Applicant: Rohde & Schwarz GmbH & Co. KG, München (DE)

(72) Inventor: Philip Mehrgardt, Zuchwil (CH)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days. days.

(21) Appl. No.: 14/975,965

(22) Filed: Dec. 21, 2015

(65) Prior Publication Data
US 2016/0183108 A1 Jun. 23, 2016

(30) Foreign Application Priority Data
Dec. 19, 2014 (EP) ..................................... 14199375

(51) Int. Cl.
*H04W 24/06* (2009.01)
*H04W 64/00* (2009.01)
*H04W 24/10* (2009.01)
*F25B 21/02* (2006.01)
*H04B 1/3822* (2015.01)
*H04B 1/3877* (2015.01)
*H05K 5/06* (2006.01)
*H05K 7/20* (2006.01)

(52) U.S. Cl.
CPC .............. *H04W 24/06* (2013.01); *F25B 21/02* (2013.01); *H04B 1/3822* (2013.01); *H04B 1/3877* (2013.01); *H04W 24/10* (2013.01); *H04W 64/00* (2013.01); *H05K 5/06* (2013.01); *H05K 7/20136* (2013.01)

(58) Field of Classification Search
CPC ..... H04W 24/06; H04W 24/10; H04W 64/00; H04W 24/02; H04W 24/08; H04W 24/04

USPC ..... 455/63.3, 456.1, 456.2, 559, 571, 575.9, 455/345, 346, 77; 340/524; 358/1.15
See application file for complete search history.

(56) References Cited

U.S. PATENT DOCUMENTS

| | | | | |
|---|---|---|---|---|
| 7,539,489 | B1 * | 5/2009 | Alexander | H04W 24/06 370/241 |
| 2002/0109518 | A1 * | 8/2002 | Saito | G01R 1/0458 324/750.09 |
| 2002/0160717 | A1 * | 10/2002 | Persson | G01R 29/0821 455/67.11 |
| 2003/0142439 | A1 * | 7/2003 | Hidaka | G11B 33/1406 360/99.13 |

(Continued)

FOREIGN PATENT DOCUMENTS

EP    1 739 443 A1    1/2007

OTHER PUBLICATIONS

Extended European Search Report for European Application No. 14199375.8 (dated Jun. 17, 2015).

*Primary Examiner* — Inder Mehra
(74) *Attorney, Agent, or Firm* — Schumaker & Sieffert, P.A.

(57) ABSTRACT

The present invention relates to a measurement housing adapted to receive at least one mobile communication device for measurement of a wireless communication of said mobile communication device, wherein said measurement housing is transparent to high frequency signals and comprises a temperature control unit adapted to control an internal temperature within said measurement housing. The present invention further relates to a casing for holding such a measurement housing.

11 Claims, 10 Drawing Sheets

(56) References Cited

U.S. PATENT DOCUMENTS

2013/0175819 A1\* 7/2013 Hindle ..................... B60P 3/00
 296/24.3

\* cited by examiner

MEASUREMENT HOUSING FOR A COMMUNICATION DEVICE

PRIORITY CLAIM

This application claims the benefit of European Application No. 14199375.8, filed Dec. 19, 2014; the disclosure of which is incorporated herein by reference in its entirety.

TECHNICAL FIELD

The invention relates to a measurement housing for a communication device especially a mobile phone and to a method for measuring a wireless communication performed by a mobile communication device.

TECHNICAL BACKGROUND

Quality of communication in a mobile radio network depends on the quality of the network infrastructure comprising base stations and other fixed components of the mobile network as well as on the quality of the used mobile communication devices. A mobile communication such as a mobile telephone comprises an antenna to communicate with the base station of the mobile network via a wireless link. Mobile handheld devices can differ greatly in their features, screen sizes, resolution and hardware capabilities. Mobile devices such as mobile phones can use a wide variety of mobile operating systems. Further, mobile services are provided by different network operators using different technologies such as CDMA or GSM. Each network operator can utilize a different kind of network infrastructure influencing the wireless link. Network performance has a strong impact on the user experience in particular when performing mobile browsing. As mobile devices grow thinner and become more powerful with each generation, common effects come more relevant. Thermal throttling is used to reduce temperature and to protect a processor of the mobile device from overheating. Thermal throttling is used to make sure that a rising temperature cannot damage the hardware of the mobile device in particular its processor. To avoid thermal effects on the performance of a mobile communication device during testing it is necessary to maintain the ambient temperature of the mobile communication device constant. For testing the wireless communication of a mobile communication device it is necessary to move the mobile communication device in the field to measure different parameters of the wireless connection or link, for instance the signal level of the received signal and/or its signal to noise ratio SNR. The signal quality of a mobile radio network operated by a network operator can vary significantly depending on where the mobile communication device is currently positioned.

In a conventional test equipment the antenna elements of mobile communication devices to be tested are connected to a measurement apparatus located within a mobile vehicle. This measurement apparatus performs measurements of mobile communication devices transported by the vehicle at room temperature within the measurement vehicle. However, this conventional test equipment has several disadvantages. In the conventional test equipment the antenna elements have to be tapped and the antenna signals are transported via a signal line to the test apparatus located within the vehicle. A tapping of the antenna elements is very cumbersome and time consuming and prone to errors. Furthermore, the antenna signals have to be transported through signal lines which may influence the tapped antenna signal, i.e. both the received as well as the transmitted antenna signals. Further, the mobile communication devices within the vehicle are measured at room temperature within a room of the measuring vehicle. Since it is difficult to maintain the room temperature in a specific temperature range influences of temperature changes on the behavior of the mobile communication devices to be tested cannot completely be avoided. Moreover, this conventional test environment does not allow to change the ambient temperature of the mobile communication devices under test deliberately so that impacts of such temperature changes on the mobile communication devices cannot be tested or monitored. Using a conventional test equipment for measuring a wireless communication of a mobile communication device is still influenced by environmental changes such as temperature changes reducing the preciseness of the test results. Further, a conventional test equipment is difficult to handle and requires tapping of the antenna elements of the measured mobile communication devices under test thus reducing the reliability of the test results. Moreover, the conventional test equipment does not allow to control the ambient temperature of the mobile communication devices to test also the influence of temperature fluctuations on the wireless communication.

Accordingly there is a need to provide an apparatus and a method to increase the reliability and/or preciseness of test results when measuring a wireless communication of a mobile communication device.

SUMMARY

The invention provides according to a first aspect a measurement housing adapted to receive at least one communication device for measuring of a wireless communication of said mobile communication device, wherein said measurement housing is transparent to high frequency signals and comprises a temperature control unit adapted to control an internal temperature within said measurement housing.

An advantage of the measurement housing according to the first aspect of the present invention resides in that no tapping of an antenna element of the mobile communication device is necessary to measure a wireless communication performed by said mobile communication device. Since no tapping of the antenna element of the mobile communication device is required it is also necessary to connect the antenna of the mobile communication device to an external measurement apparatus. Consequently, the measurement setup is less cumbersome and less prone to connection errors. Furthermore, any impact on the measurement results by a signal line connecting the antenna of the mobile communication device with an external measurement apparatus is avoided. Moreover, the measurement housing according to the first aspect of the present invention provides the additional advantage that it is also possible to deliberately or intentionally change the temperature in the measurement housing to test the impact of temperature changes on the measured wireless communication of the mobile communication device.

In a possible embodiment of the measurement housing according to the first aspect of the present invention the temperature control unit comprises ventilation means especially a fan for ventilating air within the measurement housing and an inner heat sink located in said measurement housing adapted to cool the air circulating within said measurement housing around said communication device driven by the ventilation means.

In a possible embodiment of the temperature control unit according to the first aspect of the present invention the temperature control unit comprises an outer heat sink attached to an outside of said measurement housing and a peltier element arranged between the inner heat sink and the outer heat sink of said temperature control unit.

Provision of a peltier element has the advantage that the temperature in the measurement housing can be either decreased or increased to maintain the temperature in a chamber of said measurement housing receiving said mobile communication device within a predetermined temperature range.

In a further possible embodiment of the measurement housing according to the first aspect of the present invention the temperature control unit comprises an electronic control circuit configured to control operation of the ventilation means and/or the peltier element in response to temperature sensor data generated by at least one temperature sensor.

In a possible embodiment the temperature sensor generating temperature sensor data applied to the electronic control circuit of said temperature control unit is formed by a temperature sensor mounted within said measurement housing.

In a further possible embodiment of the measurement housing according to the first aspect of the present invention the temperature sensor generating the temperature sensor data applied to the electronic control circuit of the temperature control unit is formed by a temperature sensor integrated in the mobile communication device under test.

In a further possible embodiment of the measurement housing according to the first aspect of the present invention the measurement housing defines a chamber for receiving the mobile communication device and is configured to seal the chamber from environmental influences, especially temperature fluctuations and/or humidity.

This provides the advantage that any negative impact of environmental influences on the reliability and preciseness of the test results is minimized.

In a still further possible embodiment of the measurement housing according to the first aspect of the present invention the measurement housing is made of a thermally insulating material having a high electromagnetic transmissibility or permittivity and being transparent to high frequency signals.

This has the advantage that any negative impact of the measurement housing itself on electromagnetic signals received by an antenna of the mobile communication device or transmitted by an antenna of the mobile communication device under test during the wireless communication is avoided.

In a still further possible embodiment of the measurement housing according to the first aspect of the present invention the measurement housing is at least partially covered with an attenuation material layer comprising a frequency dependent electromagnetic transmissibility in a predetermined frequency range. Using this embodiment allows to simulate an impact of a attenuation on the measurement results.

In still a further possible embodiment of the measurement housing according to the first aspect of the present invention the measurement housing comprises no interface and the mobile communication device received within a chamber of said measurement housing is configured to perform at least one measurement program autonomously.

In an alternative embodiment of the measurement housing according to the first aspect of the present invention the mobile communication device received within said measurement housing is connected via an interface of said measurement housing to an external measurement control unit configured to perform at least one measurement program.

The invention further provides according to a second aspect a casing for holding at least one measurement housing according to the first aspect of the present invention wherein said casing comprises at least one channel having external ventilation means to supply an airstream to outer heat sinks of measurement housings mounted in said casing.

In a possible embodiment of the casing according to the second aspect of the present invention the casing comprises a measurement control unit adapted to control the external ventilation means of said casing.

In still a further possible embodiment of the casing according to the second aspect of the present invention the casing comprises a measurement control unit connected via interfaces to the temperature control units of measurement housings mounted in said casing.

In a further possible embodiment of the casing according to the second aspect of the present invention the casing comprises a roof box mounted on top of a vehicle.

In a further possible embodiment of the casing according to the second aspect of the present invention the casing comprises a trailer box mounted on a trailer of a vehicle.

The invention provides according to the third aspect a method for measuring a wireless communication performed by mobile communication device within a measurement housing transparent to high frequency signals, wherein an internal temperature within said measurement housing is maintained constant during the measurement of the wireless communication.

In a possible embodiment of the invention according to the third aspect of the present invention the temperature within the measurement housing is maintained in a predetermined temperature range having a maximum temperature and a minimum temperature.

In still further possible embodiment of the method according to the third aspect of the present invention the wireless communication is performed by means of signals received and/or transmitted by an antenna of the mobile communication device under test.

In a still further possible embodiment of the method according to the present invention the electromagnetic signals are deliberately attenuated using an attenuation material with a frequency dependent electromagnetic transmissibility attached to the measurement housing.

BRIEF DESCRIPTION OF FIGURES

In the following possible embodiments of the different aspects of the present invention are described in more detail with reference to the enclosed figures.

DETAILED DESCRIPTION OF EMBODIMENTS

Figure 1:
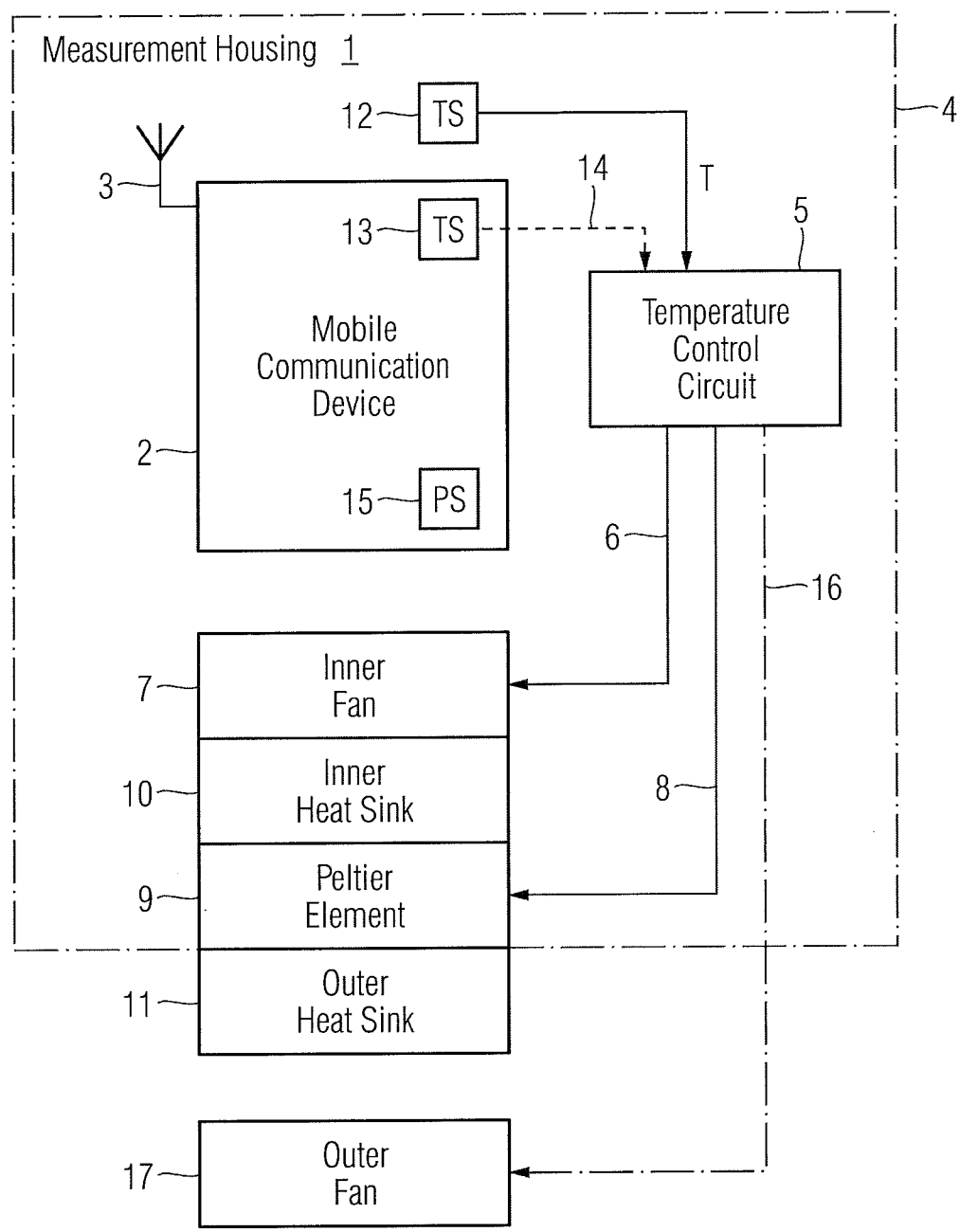
FIG. 1 shows a block diagram for illustrating a possible exemplary embodiment of a measurement housing according to the first aspect of the present invention.

As can be seen in FIG. 1 the measurement housing 1 according to the first aspect of the present invention comprises in the illustrated embodiment a chamber for receiving at least one mobile communication device 2 having at least one antenna 3. The mobile communication device 2 received by the measurement housing 1 can be a mobile telephone in particular a smartphone. In a possible embodiment the form of the chamber of the measurement housing 1 is adapted to the form and dimensions of the mobile communication device 2 received within the measurement housing 1. The measurement housing 1 comprises a measurement housing wall 4 made of a material transparent to high frequency signals and in particular transparent to high frequency signals used by mobile communication networks. Mobile communication networks use electromagnetic signals to exchange information between mobile communication devices and base stations. A mobile communication device such as the mobile communication device 2 illustrated in FIG. 1 can receive by means of its antenna 3 signals from a base station BS of said mobile radio network in a downlink DL. Further, the mobile communication device 2 can transmit signals by means of its antenna 3 to a base station BS of the mobile communication network in an uplink UL. Accordingly the frequency range used by the mobile communication device 2 comprises in a possible embodiment two frequency bands, i.e. a first frequency band for the uplink UL to transmit data from the mobile communication device 2 to the base station BS and a second frequency band for the downlink DL to receive data from the base station BS by the mobile communication device 2. For example, a UMTS network can use frequencies from 1920 to 1980 MHz as well as 2110 to 2177 MHz for communication. For a mobile broadband service, in particular LTE networks frequencies are located in the 800 MHz, 1.8 GHz, 2 GHz and 2.6 GHz ranges. The measurement housing wall 4 of the measurement housing 1 made from a material transparent to these high frequency signals does not influence the wireless communication of the mobile communication device 2 with an external base station BS of a mobile communication network or any other device. The measurement housing 1 comprises a temperature control unit adapted to control an internal temperature T within said measurement housing 1. As shown in FIG. 1 the temperature control unit comprises in the illustrated embodiment a temperature control circuit 5 configured to control actuators to maintain the temperature T within said measurement housing 1 at a constant level. The temperature control circuit 5 controls via a first control signal line 6 inner ventilation means especially an inner fan 7 located within the measurement housing 1 and via a second signal control line 8 a peltier element 9. The inner fan 7 is attached to an inner heat sink 10 or cooling element provided within the measurement housing 1. The inner heat sink 10 or cooling element is adapted to cool air circulating within said measurement housing 1 around the mobile communication device 2 wherein the circulating air is driven by the inner fan or inner ventilator 7 of the temperature control unit. The temperature control unit further comprises the peltier element 9 which is arranged in a possible embodiment between the inner heat sink 10 and an outer heat sink 11 attached to the measurement housing 1.

The temperature control unit is configured in a possible embodiment to control the inner fan 7 and/or the peltier element 9 in response to temperature sensor data generated by at least one temperature sensor to maintain the temperature T within said measurement housing 1 constant. The temperature sensor can in a possible embodiment comprise a temperature sensor 12 provided within said measurement housing 1 as illustrated in FIG. 1. In a still further possible embodiment the temperature sensor can also be formed by a temperature sensor 13 integrated in the mobile communication device 2 and connected to the temperature control circuit 5 via a signal line 14.

As shown in FIG. 1 the mobile communication device 2 can comprise an integrated power supply 15 to supply the mobile communication device 2 with electrical power during measurement tests. In a possible embodiment the temperature control circuit 5 further controls via a control line 16 outer ventilation means especially an outer fan 17 positioned outside the measurement housing 1. The measurement housing 1 is configured in a preferred embodiment to seal the received mobile communication device 2 from environmental influences especially temperature fluctuations and/or external humidity. The measurement housing wall 4 is made in a preferred embodiment of a thermally insulating material with high electromagnetic transmissibility being transparent to high frequency signals in particular in frequency ranges used by a mobile communication network. The measurement housing wall 4 comprises in a possible embodiment a thermally insulating material with high electromagnetic transmissibility such as expanded polystyrene. In a possible embodiment the measurement housing wall 4 comprises an Acrylonitrile Butadiene styrene (ABS) plastic comprising a high electromagnetic permittivity or transmissibility. In an alternative embodiment the measurement housing wall 4 is made of a material comprising Acrylonitrile styrene Acrylate (ASA) plastic. These materials comprise a high heat and high impact resistance. In a possible embodiment of the measurement housing 1 further comprise an adhesive thermal insulation. In a further possible embodiment the measurement housing wall 4 can comprise polystyrol.

The peltier element 9 controlled by the electronic temperature control circuit 5 of the temperature control unit can be used to create a heat flux. The peltier element 9 is a solid state active heat pump which is adapted to transport heat from one side to the other side using electrical energy depending on the direction of the electrical current. The peltier element 9 forms a thermoelectric cooler TEC. In a possible embodiment of the peltier element 9 controlled by the temperature control circuit 5 can be operated in two different operation modes. In a first operation mode the peltier element 9 is controlled such that it does transport heat from the inner chamber of the measurement housing 1 to the outer heat sink 11. Further, the peltier element 9 can be operated in a second operation mode to transport heat from the outside into the inner chamber of the measurement housing 1. If the internal temperature T within the measurement housing 1 exceeds a maximum threshold the peltier element 9 is activated to transport heat from within the measurement housing 1 to the outside while when the temperature within the measurement housing 1 falls beneath a lower temperature threshold the peltier element 9 is used to increase the temperature within the measurement housing 1 by transporting heat from the outside to the inside of the measurement housing 1. In this way the peltier element 9 can be used in a possible embodiment to keep the temperature T within the measurement housing 1 in a predetermined temperature range having a minimum temperature threshold and a maximum temperature threshold.

In a possible embodiment the temperature control unit of the measurement housing 1 can comprise an integrated power supply such as a battery or accumulator providing electrical power to drive the peltier element 9. In a further possible embodiment electrical power can be supplied from an external power supply source to the temperature control unit. The external power supply source can be for instance a photovoltaic cell and/or a battery of a vehicle. In a still further possible embodiment a power supply 15 integrated in the mobile communication device 2 can also be used for supplying the peltier element 9 of the temperature control unit. The temperature sensor 12 within the measurement housing 1 and/or the temperature sensor 13 integrated or embedded in the mobile communication device 2 under test can be used to control the peltier element 9 and/or the inner and outer ventilation means 7, 17.

Figure 2:
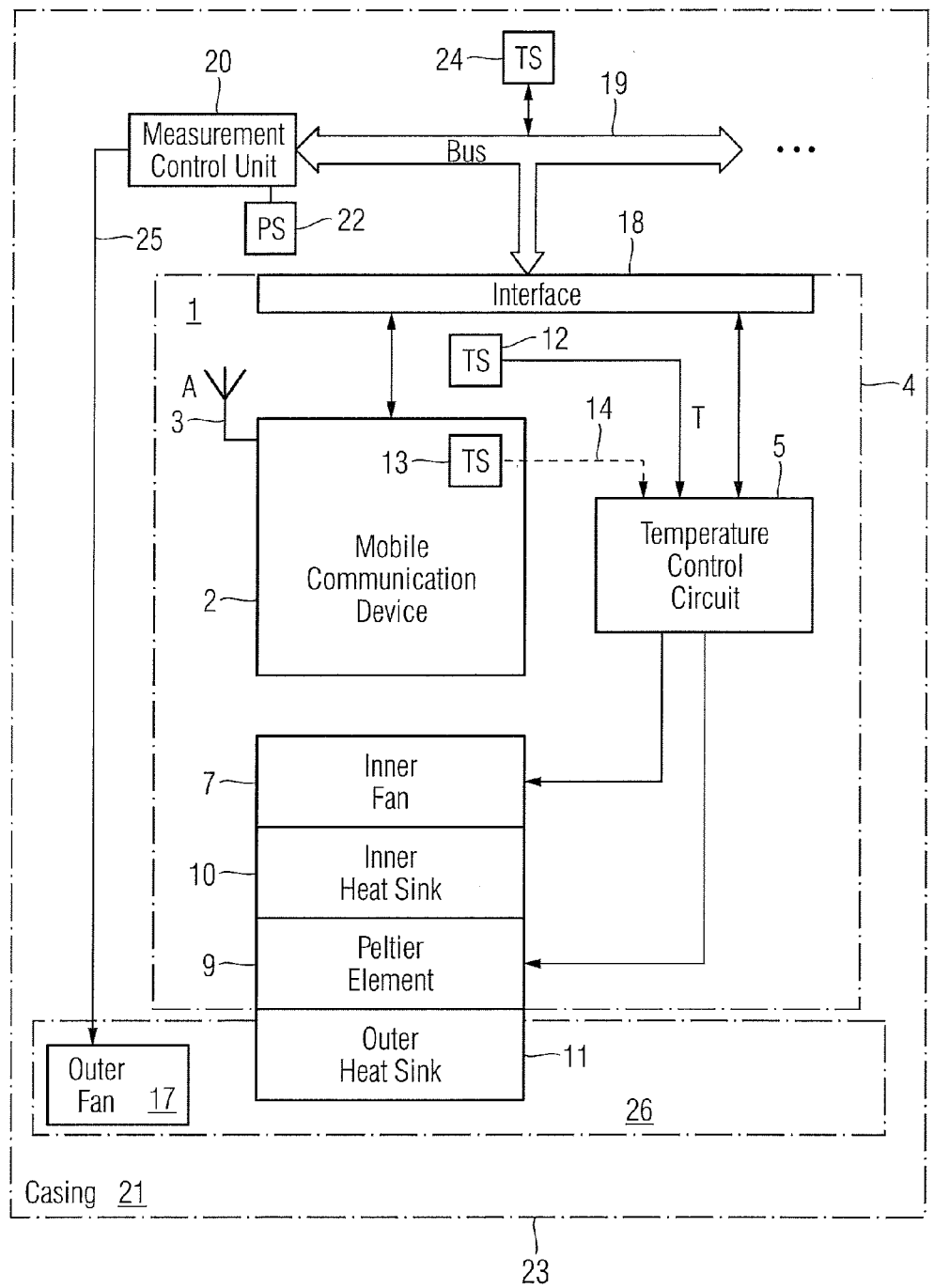
FIG. 2 shows a further block diagram for illustrating a further possible exemplary embodiment for a measurement housing according to the first aspect of the present invention mounted in a casing according to a further aspect of the present invention.

FIG. 2 shows a block diagram of a further possible exemplary embodiment of a measurement housing 1 according to the present invention. In the shown embodiment of FIG. 2 the measurement housing 1 comprises a data and control interface 18 connected a data and control bus 19. The bus 19 can be connected to a measurement control unit 20 of a casing 21 which can be configured to hold several measurement housings 1 for performing measurements of wireless communications of different mobile communication devices 2 at the same time. In a possible embodiment the measurement control unit 20 is supplied with electrical power by a power supply unit 22 of the casing. The power supply unit 22 of the casing can be a photovoltaic module having photovoltaic cells attached to a casing wall 23 of the casing 21. The interface 18 of the measurement housing 1 can be formed in a possible exemplary embodiment by a USB interface. In a possible embodiment the casing 21 can also comprise one or several temperature sensors 24 adapted to measure the temperature within the casing 21. In the embodiment illustrated in FIG. 2 the measurement control unit 20 of the casing 21 is further adapted to control via a control line 25 an outer fan 17 provided within a channel 26 of the casing 21. In a possible embodiment the casing 21 comprise at least one channel or duct having an external fan 17 to supply an airstream to the outer heat sink 11 of the at least one measurement housing 1 mounted in the casing 21 as illustrated in FIG. 2. In a possible embodiment the mobile communication device 2 and/or the temperature control circuit 5 as well as the actuators 7, 9 are supplied with electrical power through the interface 18 and the bus 19 of the casing 21 adapted to transport electrical energy from the power supply unit 22 of the casing 21 to the different components during measurement of the wireless communication of the mobile communication device 2. The power supply of the active components can be performed in different ways. In a possible embodiment the mobile communication device 2 is supplied with electrical power by an integrated power supply unit or battery 15, whereas other components such as a temperature control circuit 5 and the ventilation or means 7, 17 and the peltier element 9 are supplied by the power supply unit 22 of the casing 21. In a possible embodiment the casing wall 23 of the casing 21 is made of a material that does not influence the electromagnetic signals exchanged via the wireless link between the antenna 3 of the mobile communication device 2 and an antenna of a base station BS of a mobile radio network.

In a possible embodiment the measurement of the communication of the mobile communication device 2 is performed under control of a measurement test program executed by a microprocessor of the mobile communication device 2. In a possible embodiment the test measurement program is executed autonomously by the mobile communication device 2 after the mobile communication device 2 has been placed in the measurement housing 1 and the measurement program has been activated. In a possible embodiment the measurement test program is formed by an application program executed by a smartphone 2 under test. The application program can be downloaded in a possible embodiment from a test server. The test application program is adapted in a preferred embodiment to the hard and/or software components of the mobile communication device 2 under test. This embodiment has the advantage that the mobile communication is measured autonomously by a mobile communication device 2 in a controlled environment. In a further possible embodiment the mobile communication device 2 is connected via its interface 18 to an external measurement control unit 20 as shown in FIG. 2, wherein the measurement control unit 20 is configured to perform a measurement program for measuring a wireless communication of the mobile communication device 2. The measurement control unit 20 can be configured to control mobile communication of different mobile communication devices 2 placed in different measurement housing 1 of the casing 21 at the same time. In this way different tests can be performed in parallel for mobile communication devices 2 of the same type to speed-up the testing procedure. In a possible embodiment the measurement control unit 20 is configured to monitor a current state of the mobile communication device 2 during measuring the wireless communication. In a further possible embodiment the measured wireless communication and/or states of the mobile communication device 2 during the wireless communication test are stored in a data memory connected to the measurement control unit 20 for further evaluation. Depending on the internal temperature T within the measurement housings 1 and/or depending on the temperature T within the casing 21 measured by the temperature sensor 24 the measurement control unit 20 can control outer ventilation means especially an outer fan 17 located within the channel 26 to transport air through the channel 26 along the outer heat sink 11 of the measurement housing 1. In a possible embodiment of the measurement housing 1 as illustrated in FIGS. 1, 2 the measurement housing wall 4 comprises a lid to place a mobile communication device 2 in the receiving chamber of the measurement housing 1 for testing and to take a mobile communication device 2 out of the measurement housing 1 after the measurement sequence has being finished. In a possible embodiment the measurement housing 1 is configured to seal the received mobile communication device 2 from any environmental influences especially temperature fluctuations and/or humidity. The measurement housing 1 encapsulates the mobile communication device 2 placed in a receiving chamber of the measurement housing 1. The measurement housing wall 4 is made in a preferred embodiment from a material having low density and/or weight allowing an easy transport of the measurement housing 1.

Figure 3:
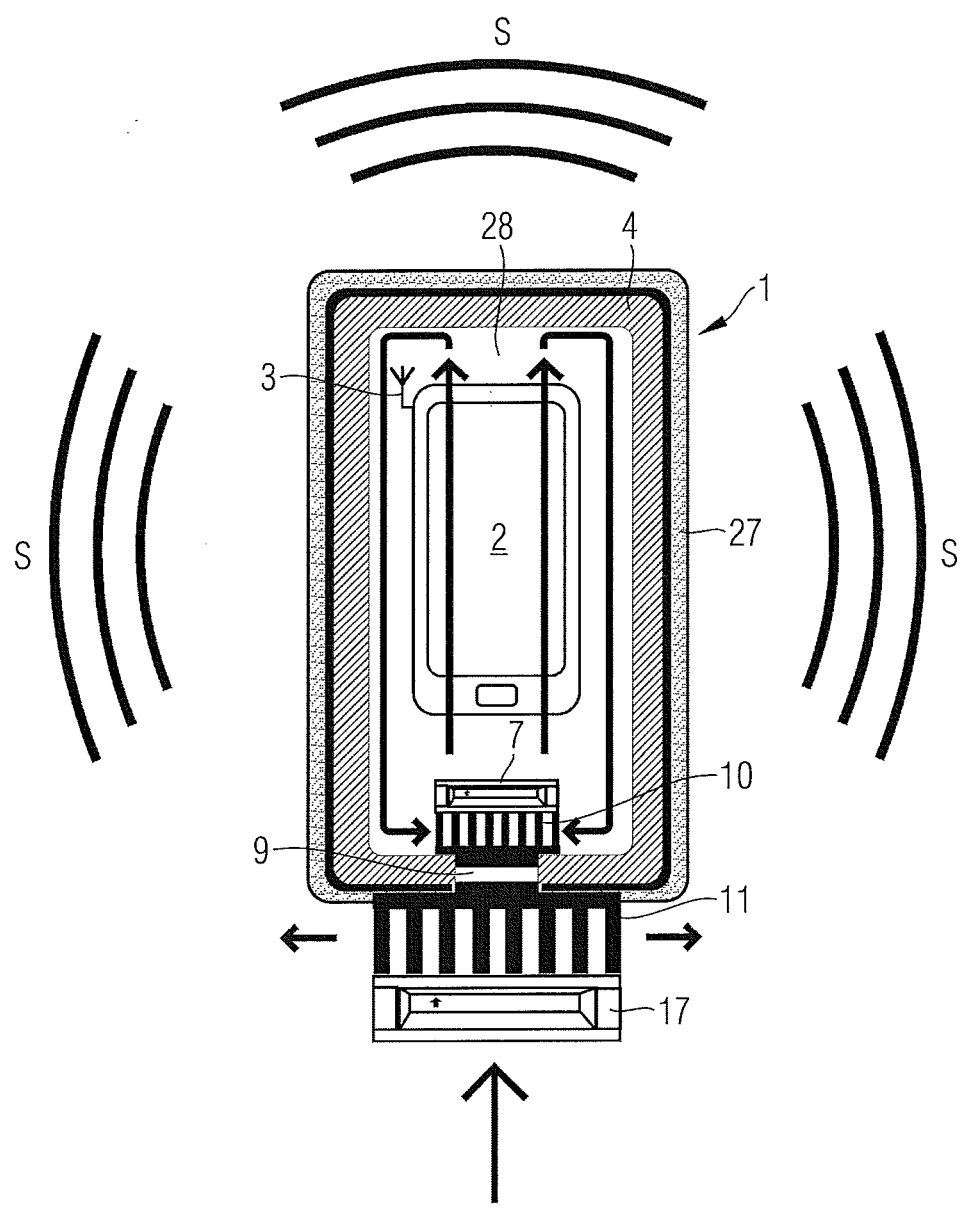
FIG. 3 shows a schematic front sectional view on an exemplary embodiment of a measurement housing according to the first aspect of the present invention.

FIG. 3 shows a sectional front view of a measurement housing 1 according to an aspect of the present invention. The measurement housing 1 comprises a measurement housing wall 4 made of a thermally insulating material preferably having high electromagnetic transmissibility transparent to high frequency signals S. The measurement housing wall 4 is at least partially covered with an attenuation material layer 27 comprising in a predetermined frequency range a frequency dependent electromagnetic transmissibility or permittivity. The attenuation material layer 27 is in a possible embodiment attached to the measurement housing wall 4. In a possible embodiment the attenuation material layer 27 can be sticked to the measurement housing wall 4 and can be replaced for other tests. As can be seen in FIG. 3 the mobile communication device 2 such as a smartphone is placed in the receiving chamber 28 of the measurement housing 1 and air is circulated around the mobile communication device 2 under test in a laminar flow. The inner heat sink 10 cools the surrounding air vented through the inner fan 7 attached to the inner heat sink 10. The air is blown against the convection direction creating a constant temperature across the surface of the mobile communication device 2 under test. The temperature controlled outer fan 17 can dissipate waste heat. The temperature controlled inner fan 7 is adapted to cool the mobile communication device 2 under test. Both fans or ventilation means 7, 17 as well as the peltier element 9 can be controlled in a possible embodiment by a temperature control circuit 5 as illustrated in FIGS. 1, 2. In the embodiment illustrated in FIG. 3 the mobile communication device 2 placed in the measurement housing 1 is formed by a mobile telephone in particular by a mobile smartphone. The mobile communication device 2 can also be formed by other mobile communication devices such as data sticks or other mobile entities. In a preferred embodiment of the mobile communication device 2 is clamped vertically in the receiving chamber 28 to provide an optimal antenna characteristic of its antenna 3.

Figure 4:
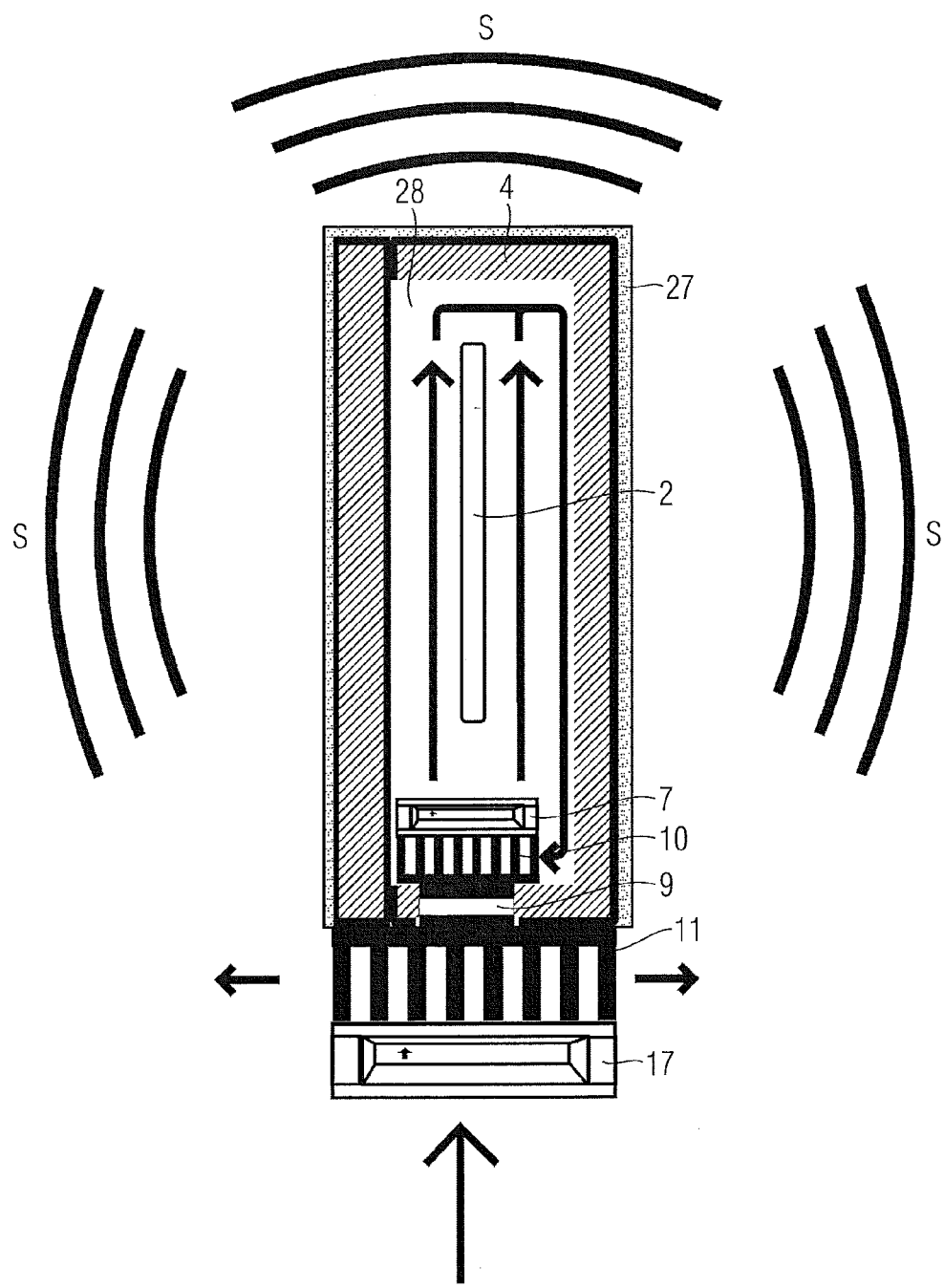
FIG. 4 shows a schematic side sectional view of a measurement housing illustrated in FIG. 3.

FIG. 4 shows a sectional side view through measurement housing 1 as illustrated in FIG. 1. FIG. 4 illustrates air circulating within the receiving chamber 28 around the mobile communication device 2 driven by an internal fan 7 of the temperature control unit or cooled by a heat sink 10 of the temperature control unit. As can be seen in FIG. 4 the cooling air circulates around the housing of the mobile communication device 2 under test in a laminar flow.

Figure 5:
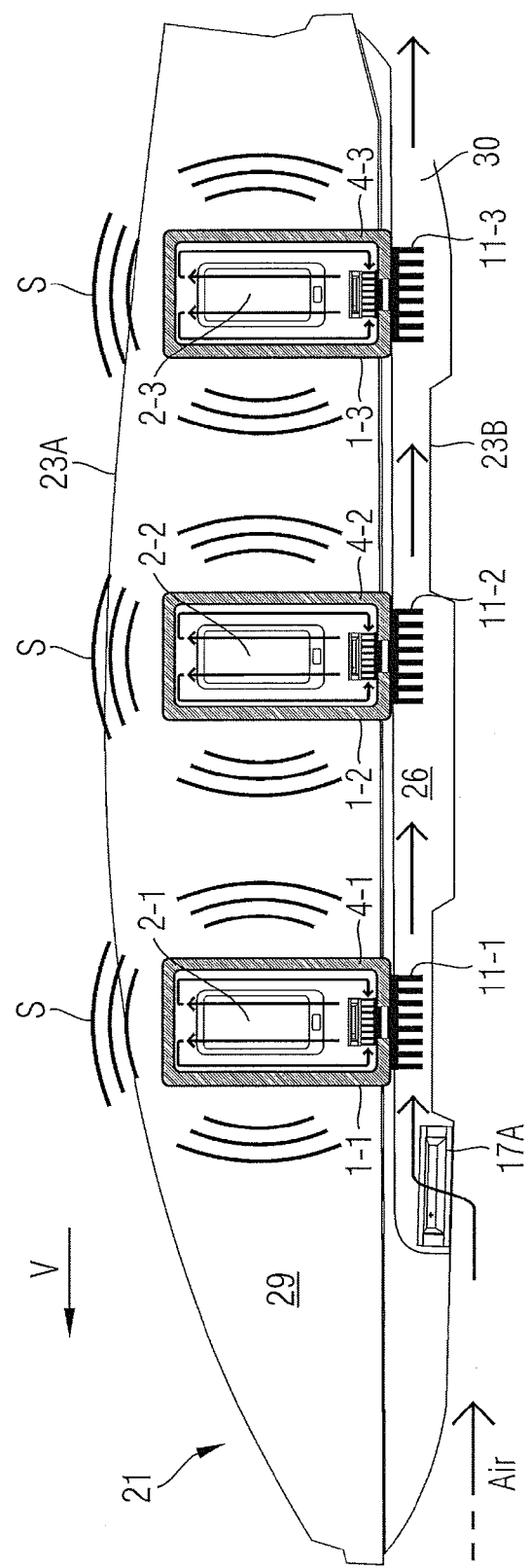
FIG. 5 shows a schematic sectional view through an exemplary embodiment of a casing according to the second aspect of the present invention.

FIG. 5 shows a cross-section view through a casing 21 according to a further aspect of the present invention. In the illustrated embodiment the casing 21 is a roof box which can be mounted on a roof of a vehicle. The casing 21 comprises a casing wall 23 transparent to high frequency signals as illustrated in FIG. 5. The casing 21 comprises a chamber 29 in which several measurement housings 1 can be mounted. The casing 21 comprises at least one channel 26. Surrounding air is drawn by an outer fan 17 into the channel or duct 26 to provide an airstream cooling the outer heat sinks 11-1, 11-2, 11-3 of measurement housings 1-1, 1-2, 1-3 mounted in the casing 21. In the embodiment shown in FIG. 5 the outer fan 17 is located at the front side of the vehicle and draws the surrounding air into the channel 26. The airstream flows through the channel 26 to an opening 30 at the backend of the vehicle.

Figure 6:
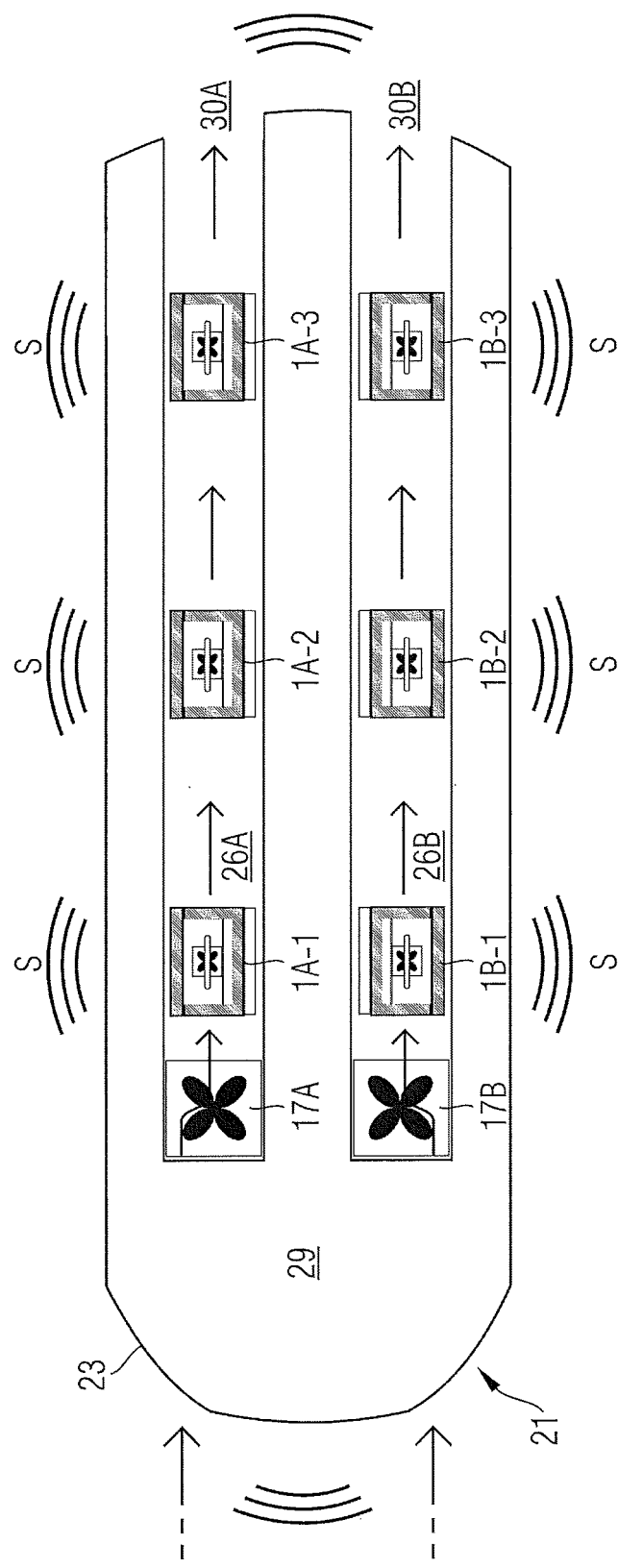
FIG. 6 shows a schematic top view on the casing as illustrated in FIG. 5.

FIG. 6 shows a sectional top view of the roof box casing 21 illustrated in FIG. 5 comprising two parallel channels 26A, 26B each equipped with an outer fan 17A, 17B. The channels 26A, 26B are provided to cool three measurement housings 1A-1, 1A-2, 1A-3 and 1B-1, 1B-2, 1B-3 respectively as illustrated in FIG. 6. In the embodiment shown in FIG. 6 the roof box casing 21 is configured to place six measurement housings 1 into the chamber 29 of the casing 21. The casing 21 is built symmetrically along an axis parallel to the driving direction of the vehicle and comprises two channels 26A, 26B used to cool outer heat sinks 11-$i$ of the measurement housings 1-$i$ mounted in the casing 21. The air streaming through the channels 26A, 26B leaves the casing 21 at the back end trough openings 30Aa, 30B as shown in FIG. 6. In a possible embodiment the roof box casing 21 comprises a upper shell 23A and lower shell 23B forming the casing wall 23 of the casing 21. The upper shell 23A of the casing 23 shown in FIG. 5 can be lifted to exchange measurement housings 1 within the casing 21. In a possible embodiment the measurement housing 1 can be mounted in the casing 21 by use of a fast mounting system. As can be seen in FIG. 5 the mobile communication devices 2-$i$ under test are clamped within the measurement housing 1 such that they are hold up vertically providing an optimal transmission and reception characteristic for high frequency signals sent or received by the antenna elements of the mobile communication devices 2-$i$. Both the container housing 23 comprising the shells 23A, 23B and the measurement housing wall 4-$i$ of the measurement housing 1-$i$ are transparent to high frequency signals S and do not influence the measurement of the wireless communication of the mobile communication devices 2-$i$ encapsulated by the measurement housings 1-$i$. Each measurement housing 1-$i$ can comprise an internal temperature control unit adapted to control an internal temperature T within a respective measurement housing 1-$i$. Cooling of the mobile communication devices 2-$i$ is supported in the shown embodiment by the airstream flowing along the outer heat sinks 11-$i$ through the channel 26.

Figure 7:
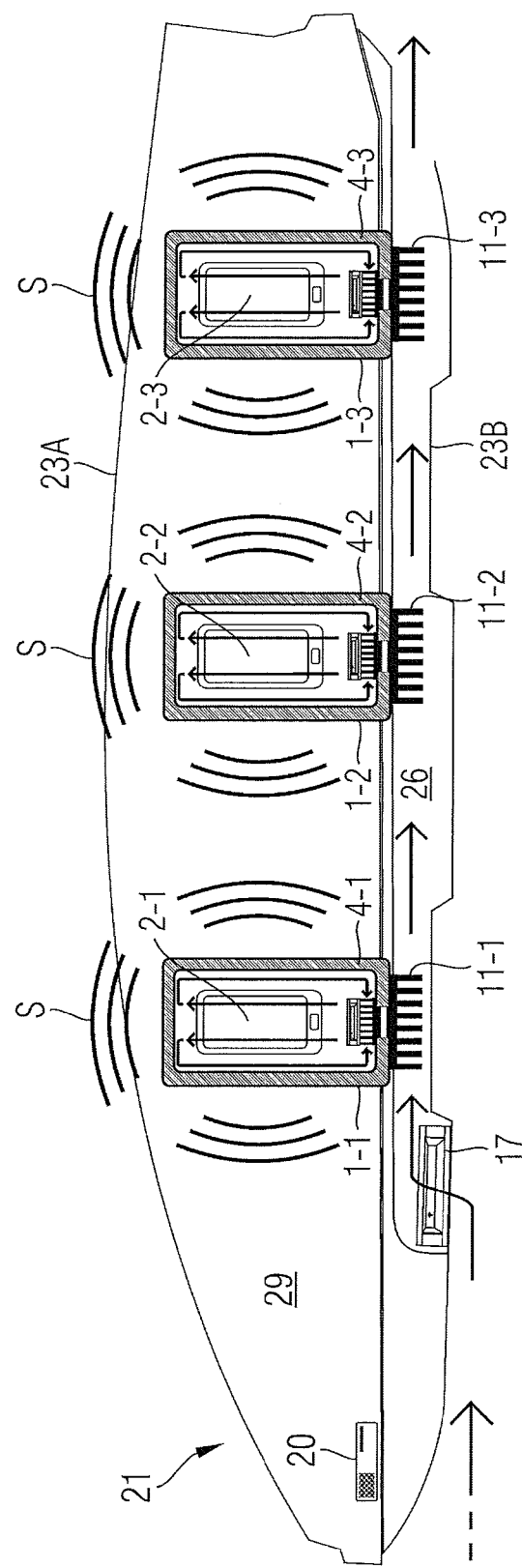
FIG. 7 shows a further schematic diagram of a further possible embodiment of a casing according to the second aspect of the present invention.
Figure 8:
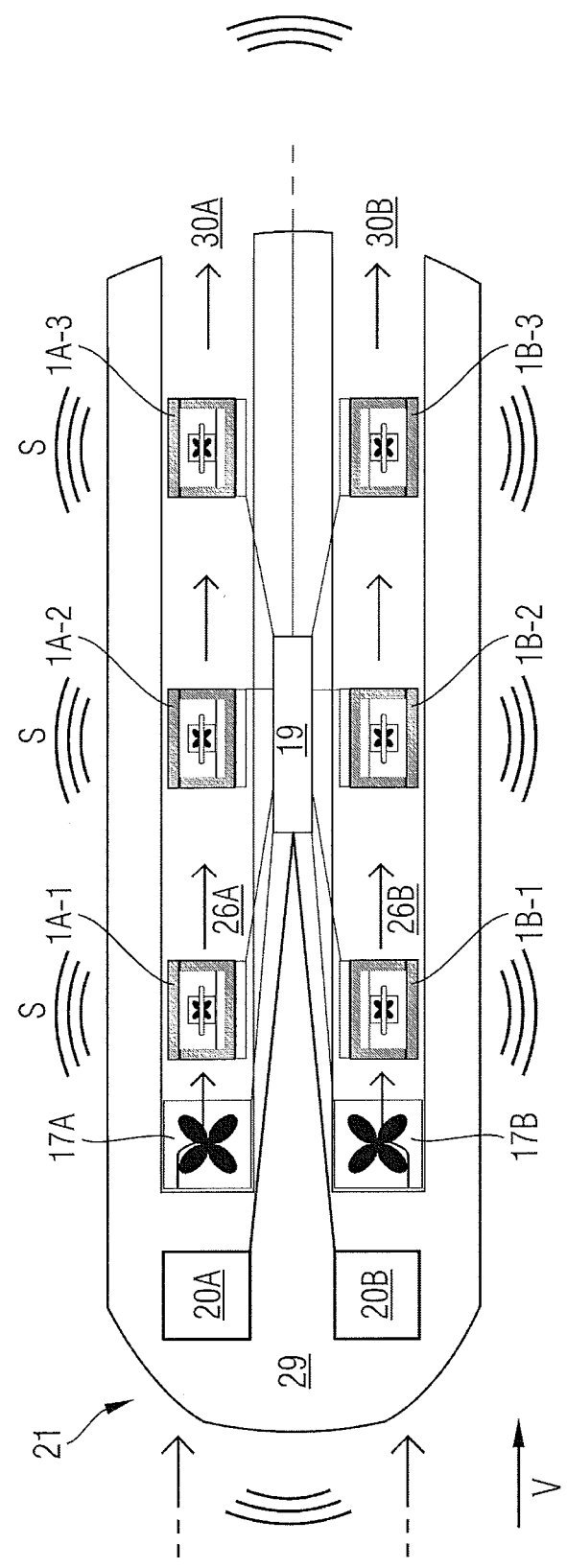
FIG. 8 shows a schematic top view on the casing illustrated in FIG. 7.

FIGS. 7, 8 show a further possible exemplary embodiment of a roof box casing 21 according to the present invention. In the shown embodiment measurement housings 1-$i$ are connected to measurement control units 20A, 20B. In the embodiment illustrated in FIG. 8 each measurement housing 1 comprises a data and control interface 18 connected to the data and control bus 19. In the embodiment illustrated in FIG. 8 two measurement control units 20A, 20B are provided and connected to the data and control bus 19. In an alternative embodiment the top roof casing 21 comprises only a single measurement control unit 20 connected to the bus 19. In the embodiment illustrated in FIGS. 7, 8 the first measurement control unit 20A is provided to control measurements of mobile communication devices received in a first row of measurement housings 1A-1, 1A-2, 1A-3 and the other measurement control unit 20B is provided to control measurement tests of mobile communication devices received by measurement housings in a second row, i.e. measurement housings 1B-1, 1B-2, 1B3. The first measurement control unit 20A is adapted in a possible embodiment to control the outer fan 17A placed in the first channel 26A of the casing 21. The second measurement control unit 20B is a in possible embodiment adapted to control the second outer fan 17B in the second channel 26B of the casing 21. In a possible embodiment both measurement control units 20A, 20B are connected via the data and control bus 19 to the temperature control units integrated in the measurement housings 1-$i$ mounted in the casing 21. In a possible embodiment the temperature T within the measurement housing 1-$i$ is controlled autonomously by a temperature control circuit 5 integrated in the respective measurement housing 1-$i$. In an alternative embodiment the temperature control in the measurement housings 1-*i* can be performed by the measurement control units 20A, 20B of the casing 21.

In a possible embodiment the measurement control unit 20, 20A, 20B comprise at least one microprocessor adapted to perform one or several measurement programs comprising instructions to perform measurement test sequences with the mobile communication devices 2 received within measurement housings 1-*i* mounted in the casing 21. In a possible embodiment different measurement programs can be performed simultaneously with different mobile communication devices 2-*i* at the same time. For example, different network parameters of a mobile radio network can be measured using mobile communication devices 2-*i* of the same type placed in different measurement housings 1-*i*. The network quality can be measured using different network quality parameters having an impact on the user experience or quality of service. Also physical network parameters such as signal to noise ratios SNRS or signal delays can be measured during the wireless communication of the mobile communication devices 2-*i* under test during the test procedures performed under the control by the measurement control program performed autonomously or under control of a measurement control program executed by a microprocessor of the measurement control unit 20 of the casing 21. The measurement control unit 20 of the casing 21 can also be used to control an internal temperature within the chamber 29 of the casing 21 in response to the temperature measured by temperature sensors 24 within the casing 21. These temperature sensors 24-*i* can also be connected to the central control and data bus 19 of the casing 21. In a still further possible embodiment the measurement control unit can receive further parameters such as the speed V of the moving casing 21 mounted on top of a vehicle. In this way the impact of changing velocity V on the wireless communication of the mobile communication devices 2-*i* can be tested. Further by changing deliberately a temperature within the measurement housings 1-*i* an influence or impact of a changing ambient temperature on the behavior of the mobile communication device 2 during wireless communication can be tested or simulated. In a possible embodiment the measurement control unit 20A, 20B can be integrated in a single measurement control unit 20 having access to a data memory configured to memorize or store test sequences and derived test results for the different mobile communication devices 2-*i*. In a possible embodiment the casing or container 21 can comprise its own power supply unit 22 formed by a battery or a photovoltaic module. In still a further possible embodiment the measurement control units 20A, 20B can be supplied with electrical power by a vehicle battery of the vehicle carrying the casing 21. In a possible embodiment the control and data bus 19 of the casing 21 comprises also power supply lines to provide electrical power to the electronic circuits within the measurement housings 1-*i* mounted in the casing 21. In a possible embodiment the power supply to a measurement housing 1-*i* can be controlled by the measurement control unit 20 of the casing 21 to measure the impact of a diminished or reduced power supply in a mobile communication device 2-*i* under test during its wireless communication.

Figure 9:
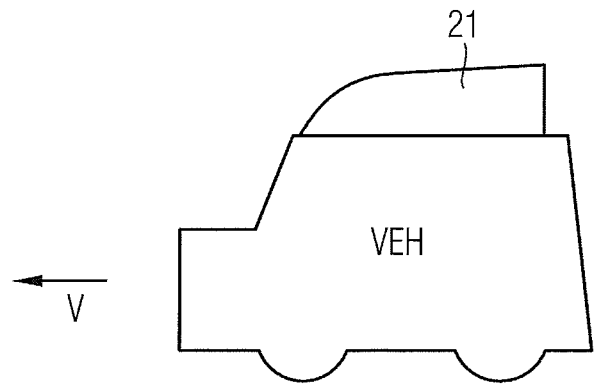
FIG. 9, 10 illustrate possible exemplary embodiments of a casing according to the second aspect of the present invention.
Figure 10:
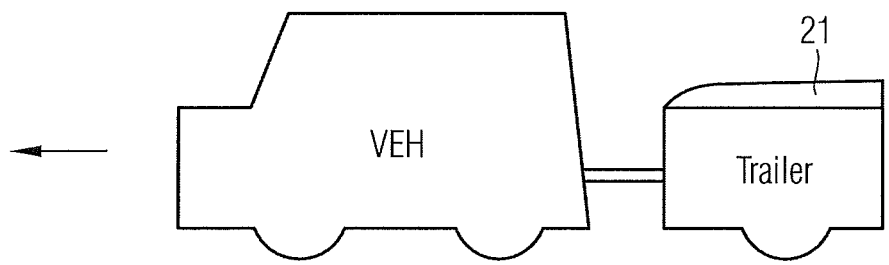

FIGS. 9, 10 show further possible embodiment of a casing 21 according to the second aspect of the present invention. In the embodiment illustrated in FIG. 9 the casing 21 is mounted on a roof of a vehicle VEH which can drive the casing 21 with a vehicle speed V. In the embodiment illustrated in FIG. 10 the casing 21 is mounted on a trailer of the vehicle VEH driving the casing 21 a speed V. In a preferred embodiment the casing 21 comprises an aerodynamic shape to reduce its air resistance during driving.

Figure 11:
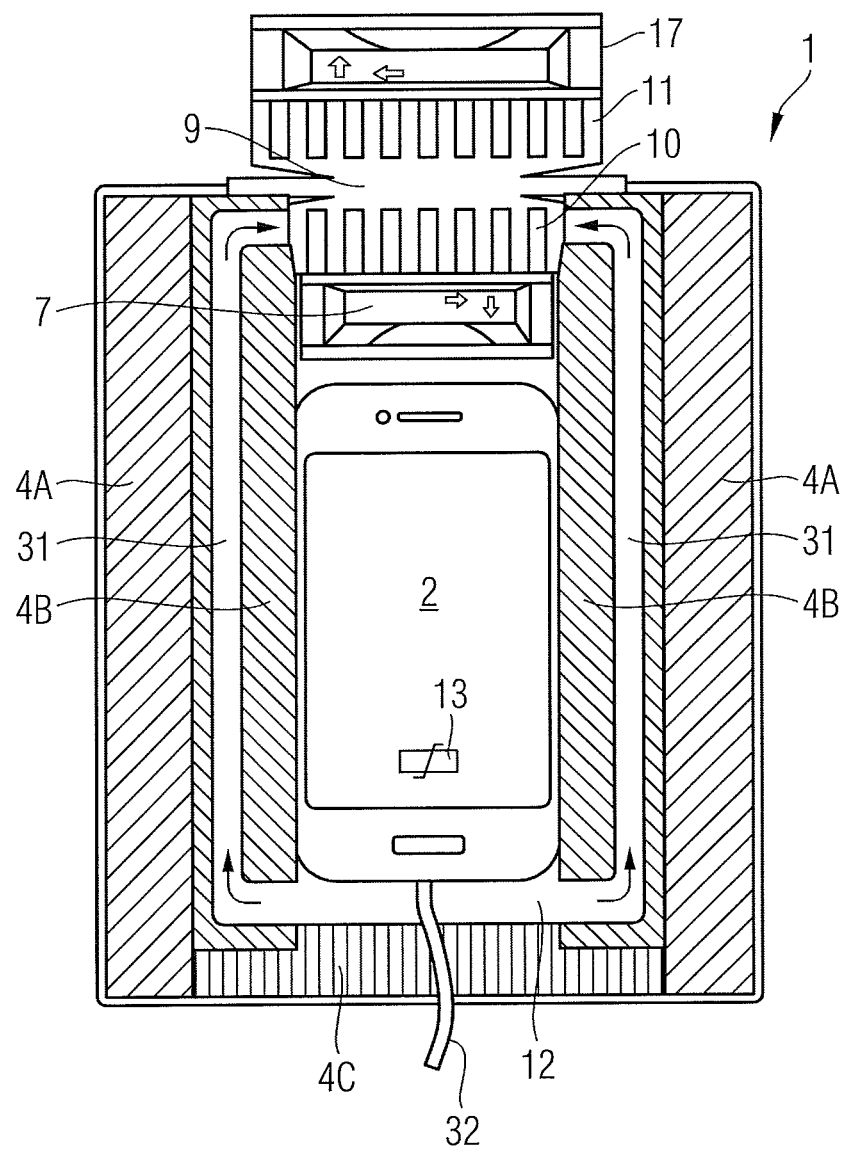
FIG. 11 shows a schematic sectional view through a further possible exemplary embodiment of a measurement housing according to the first aspect of the present invention.

FIG. 11 shows a further exemplary embodiment of a measurement housing 1 according to the present invention. In the shown exemplary embodiment the measurement housing 1 is of cylindrical shape comprising a cylindrical measurement housing core 4B inserted into an opening of an outer cylindrical casing 4A as shown in FIG. 11. The measurement housing 1 comprises on top an outer heat sink 11 to which an outer fan 17 is mounted. Between the outer heat sink 11 and the inner sink heat 10 a peltier element 9 is provided as shown in FIG. 11. Further within the measurement housing 1 an inner fan 7 is provided which is configured to generate an internal circulation of air around the housing of the mobile communication device 2 placed in the inner cylindrical core 4B having circulation channels 31. The measurement housing 1 in the illustrated embodiment comprises a temperature control unit which is adapted to control the internal temperature T within the measurement housing 1. In the shown exemplary embodiment temperature sensor data is provided by an internal temperature sensor 12 and/or by a temperature sensor 13 integrated in the mobile communication device 2 placed vertically within the inner cylindrical housing core 4B. In the shown embodiment the measurement housing 1 can comprise a lid 4C at the bottom side comprising a cable conduit for an electrical cable 32 to connect the mobile communication device 2 to an external control and data and/or a power supply bus 19. The measurement housing casing 4A and the measurement housing core 4B are transparent to high frequency signals. The inner heat sink 10 in the measurement housing 1 is adapted to cool air circulating within the measurement housing 1 around the mobile communication device 2 driven by the internal fan 7 of the temperature control unit. The temperature control unit further comprises the peltier element 9 arranged between the inner heat sink 10 of the temperature control unit and the outer heat sink 11 of the temperature control unit. The temperature control unit can comprise an electronic control circuit configured to control the inner fan 7 and the peltier element 9 in response to temperature sensor data generated by the temperature sensor 12 positioned within the measurement housing 1 and/or the temperature sensor 13 integrated in the mobile communication device 2. The measurement housing 1 is adapted to seal the received mobile communication device 2 from environmental temperature fluctuations or humidity. The measurement housing 1-*i* comprising the measurement housing outer casing 4A and the measurement housing core 4B is made in a preferred embodiment of a thermal insulating material with a high electromagnetic transmissibility transparent to high frequency signals.

In a possible embodiment the measurement housing 1 as illustrated in the embodiment of FIG. 11 is also placed in a casing mounted to a vehicle.

The measurement housing 1 shown in the embodiments of FIG. 1, 2 or 11 can also be carried in a possible embodiment by a person in a bag pack. The measurement housing 1-*i* and the measurement container 21 allows to perform a wide range of different tests in relation to a wireless communication of a mobile communication device 2 in a well defined environment.

The measurement housing 1 allows testing of the same or different mobile communication devices 2 in a controlled environment to measure the quality of a mobile radio network and/or the quality of the mobile communication devices 2-*i*. The measurements can be performed in a possible embodiment autonomously. Furthermore the measurement does not require to tap antenna elements 3 of the mobile communication devices 2-*i* under test so that during the tests also the quality the antenna elements 3-*i* of the mobile communication 2-*i* can be measured or tested. The measurement housing 1 and/or the casing 21 are made in a preferred embodiment from a material having a low weight and/or density. The mobile communication devices 2 can be tested in any kind of terrain. Because of the low weight of the measurement housing 1 a person can carry the measurement housing 1 in difficult terrain in particular trough woods or in mountains. Consequently the quality of mobile radio network in these areas can be measured or tested. In a possible embodiment the housing wall of the measurement housing 1 is made of a material providing a good thermal insulation. In a preferred embodiment the mobile communication device 2 is placed within the measurement housing 1 such that its display faces the lid of the measurement housing 1. In the embodiments illustrated in FIGS. 1, 2, 11 the temperature control unit comprises a peltier element 9 to control a heat flux in or out the measurement housing 1. In a possible embodiment other heat control elements can be used. Also the number of heat sinks or peltier elements can very depending on the size and the type of mobile communication device 2 received by the measurement housing 1. In a possible embodiment the mobile communication device 2 also provides position data in particular GPS coordinates indicating the position of the mobile communication device 2 under test. The GPS data indicates the current position of the mobile communication device 2 when performing the measurement of the wireless communication of the mobile communication device 2.

In a possible embodiment the measuring results provided by the measurement tests are related to the position data provided by the mobile communication device 2 such as GPS data. The measurement housing 1 is transparent to high frequency signals in particular to high frequency signals exchanged between the mobile communication device 2 in uplink or downlink wireless communication.

In a possible embodiment the measurement housing 1 is transparent in a specific frequency range depending on the signal frequencies used by a mobile communication network.

In a possible embodiment the element housing 1 is transparent to high frequency signals in a frequency range between 500 MHz and 3 GHz.

In a possible embodiment the measurement housing 1 can be used for different mobile communication networks using different frequencies for communication such as GSM, GPRS, HSPDA, HSUAP, HSPDA, LTE.

In a possible embodiment measurement performed by a communication device 2 within the measurement housing 1 are performed in real time and the measurement results are recorded in a data memory. The performed test comprises different test functions to perform a voice-, video- and/or messaging test to capture a user experience of a user of the mobile communication device 2-*i*. The performed test can support different mobile radio technologies and cover different multiple protocol layers in real time. In a possible embodiment the test program and/or measurement applications run by a control unit 20 can be loaded from a server to fit the mobile communication device 2 under test received by the measurement housing 1 mounted in the casing 21. This server can be connected to the control unit 20 via a casing data interface of the casing 21. In a possible embodiment the server is transported by the vehicle VEH carrying the casing 21. In a possible embodiment an operator can lift the upper shell 23A of the casing 21 and assemble the measurement housings 1 including the mobile communication devices in the casing 21. The operator can start the same or different measurement programs loaded from a database of a server transported in the vehicle VEH. Finally the measurement results or tests results of different mobile communication devices 2 are evaluated to extract quality parameters of the mobile radio network and/or the quality of the tested measurement communication devices 2. With the measurement housing or casing according to the present invention it is possible to measure or test the quality of mobile communication networks as well as the quality of different types of mobile communication devices 2 in a controlled environment.

The invention claimed is:

1. A casing for holding at least one measurement housing adapted to contain at least one mobile communication device for measurement of a wireless communication of said mobile communication device, wherein said measurement housing is transparent to high frequency signals and comprises a temperature control unit adapted to control an internal temperature within said measurement housing,
wherein the mobile communication device contained by said measurement housing is adapted to provide position data indicating a current position of the mobile communication device during measurement of the wireless communication, wherein the casing comprises a measurement control unit, wherein the measurement control unit is adapted to measure the speed of the casing as a parameter, when the casing is mounted on top of a vehicle, to test an impact of changing velocity on the wireless communication of the mobile communication device contained in the measurement housing, and
wherein the measurement housing is made of a thermally insulating material having a high electromagnetic permittivity.

2. The casing according to claim 1, wherein the temperature control unit comprises first ventilator means especially a fan for ventilating air within the measurement housing and the inner heat sink located within said measurement housing and adapted to cool the air circulating within said measurement housing around said mobile communication device driven by the ventilator means.

3. The casing according to claim 2, wherein said temperature control unit further comprises an outer heat sink attached to an outside of said measurement housing and a peltier element arranged between the inner heat sink and the outer heat sink of said temperature control unit.

4. The casing according to claim 1, wherein the temperature control unit comprises an electronic temperature control circuit configured to control operation of the ventilator means and/or the peltier element in response to temperature sensor data generated by at least one temperature sensor positioned within said measurement housing and/or formed by a temperature sensor of the mobile communication device to maintain the temperature within said measurement housing within a predetermined temperature range.

5. The casing according to claim 1, wherein the measurement housing defines a chamber for receiving the mobile communication device and, wherein the measurement housing is configured to seal the chamber from environmental influences, especially temperature fluctuations and/or humidity.

6. The casing according to claim 1, wherein the measurement housing is at least partially covered by an attenuation material layer having a frequency dependent electromagnetic permittivity in a predetermined frequency range.

7. The casing according to claim 1, wherein the mobile communication device received within a chamber of said measurement housing is configured to perform a measurement program autonomously or wherein the measurement housing comprises an interface to connect the mobile communication device received in a chamber of said measurement housing to an external measurement control unit configured to perform a measurement program.

8. The casing according to claim 1, wherein said casing comprises at least one channel having external ventilation means to supply an airstream to outer heat sinks of measurement housings mounted in said casing.

9. The casing according to claim 8, wherein said casing comprises a measurement control unit adapted to control at least one ventilation means of said casing and/or said measurement control unit of said casing being connected via interfaces to the temperature control units of the measurement housings mounted in said casing.

10. The casing according to claim 8, wherein said casing comprises a roof box mounted on top of a vehicle or a trailer box mounted on a trailer of a vehicle.

11. A method comprising:
measuring a wireless communication performed by a mobile communication device contained in a measurement housing transparent to high frequency signals, said measurement housing comprising a temperature control unit,
wherein the measurement housing is contained in a casing, wherein the casing comprises a measurement control unit, wherein the measurement control unit measures the speed of the casing as a parameter, when the casing is mounted on top of a vehicle, and
wherein the measurement housing is made of a thermally insulating material;
driving the vehicle with the mounted casing;
maintaining constant an internal temperature within said measurement housing during the measurement of the wireless communication; and
providing position data indicating a current position of the mobile communication device when performing the measurement of the wireless communication of the mobile communication device and testing the impact of a changing velocity on the wireless communication of the mobile communication device contained in the measurement housing by the speed measured by the measurement control unit.

* * * * *